United States Patent
Kinugawa

(10) Patent No.: US 10,242,898 B2
(45) Date of Patent: Mar. 26, 2019

(54) ARTICLE TRANSPORT FACILITY AND INSPECTION UNIT

(71) Applicant: Daifuku Co., Ltd., Osaka-shi (JP)

(72) Inventor: Tomotaka Kinugawa, Shiga (JP)

(73) Assignee: Daifuku Co., Ltd., Osaka-shi (JP)

(*) Notice: Subject to any disclaimer, the term of this patent is extended or adjusted under 35 U.S.C. 154(b) by 0 days.

(21) Appl. No.: 15/070,377

(22) Filed: Mar. 15, 2016

(65) Prior Publication Data

US 2016/0276191 A1    Sep. 22, 2016

(30) Foreign Application Priority Data

Mar. 16, 2015 (JP) ................................ 2015-052589

(51) Int. Cl.
*H01L 21/67* (2006.01)
*H01L 21/677* (2006.01)
*G01B 11/27* (2006.01)

(52) U.S. Cl.
CPC ........ *H01L 21/67733* (2013.01); *G01B 11/27* (2013.01); *H01L 21/67259* (2013.01)

(58) Field of Classification Search
CPC ........ H01L 21/67733; H01L 21/67259; G01B 11/27; G01B 11/272
See application file for complete search history.

(56) References Cited

U.S. PATENT DOCUMENTS

| 8,374,420 | B2* | 2/2013 | Murakami | B66C 13/22 198/339.1 |
|---|---|---|---|---|
| 9,696,262 | B2* | 7/2017 | Morikawa | G01N 21/88 |
| 2003/0075415 | A1* | 4/2003 | Ito | B65G 17/20 198/346.3 |
| 2011/0245964 | A1* | 10/2011 | Sullivan | H01L 21/6773 700/228 |
| 2013/0220959 | A1* | 8/2013 | Won | H01L 21/6773 212/276 |
| 2017/0200625 | A1* | 7/2017 | Takai | H01L 21/67733 |

FOREIGN PATENT DOCUMENTS

| JP | 59146839 | U | 10/1984 | |
| JP | 200334490 | A | 2/2003 | |
| JP | 2003192269 | A | 7/2003 | |
| JP | 2005170544 | A | 6/2005 | |
| JP | 2014116426 | * | 6/2014 | ........... H01L 21/677 |

* cited by examiner

*Primary Examiner* — Ronald P Jarrett
(74) *Attorney, Agent, or Firm* — The Webb Law Firm

(57) ABSTRACT

An article transport facility includes an alignment portion that aligns the position of an inspection unit that is transferred to a transport target location with a proper support position, and a position detection device for detecting the position of a detection target portion provided on a holding portion is provided in the inspection unit. The horizontal offset amount of the holding portion relative to the proper support position is measured based on detection information from the position detection device in a state in which the inspection unit is aligned with the proper support position and the holding portion is positioned at a release position or a release movement position.

9 Claims, 10 Drawing Sheets

ARTICLE TRANSPORT FACILITY AND INSPECTION UNIT

CROSS-REFERENCE TO RELATED APPLICATION

This application claims priority to Japanese Patent Application No. 2015-052589 filed Mar. 16, 2015, the disclosure of which is hereby incorporated in its entirety by reference.

FIELD OF THE INVENTION

The present invention relates to an article transport facility and an inspection unit.

BACKGROUND

An example of article transport facilities that are currently used is a facility including a holding portion that holds a transport object, a movement operation portion that moves the holding portion, and a transport control portion that controls the operation of the movement operation portion and the holding portion so as to transport the transport object to a transport target location. Also, an inspection unit is used in such an article transport facility. Conventional examples of the article transport facility and the inspection unit are described in JP 2005-170544A.

The article transport facility of JP 2005-170544A is configured to move a holding portion holding an article to a transport position and transfer an article to a transfer target location.

In the article transport facility of JP 2005-170544A, an inspecting position is set at a position that is spaced directly above the transport position by a set amount. In the article transport facility, the holding portion holding the inspection unit is moved to an inspecting position, and thereafter the horizontal position of a detection target portion provided at an inspection target location is detected by a detection device provided in the inspection unit. Then, an offset amount measurement portion measures a horizontal offset amount between the transport target location and the holding portion positioned at the inspecting position based on detection information from the detection device, and a position update portion updates the transport position based on a measurement result obtained by the offset amount measurement portion.

In this way, the article transport facility of JP 2005-170544A is configured to move the holding portion to the inspecting position, detect the position of the detection target portion provided at the transport target location from the inspection unit held by the holding portion, and measure the horizontal offset amount between the transport target location and the holding portion.

However, for the article transport facility and the inspection unit of JP 2005-170544A, it is necessary to provide the detection target portion at the transport target location. For this reason, when it is difficult to always provide the detection target portion at the transport target location, the operator needs to install the detection target portion at the transport target location at the time of measuring the offset amount by the inspection unit. When there are many transport target locations, the operator needs to provide the detection target portion at each of the transport target locations. This has lead to a reduction in the efficiency of the operation for measuring the horizontal offset amount of the holding portion relative to the transport target location in a state in which the holding portion is positioned at an inspecting position.

SUMMARY OF THE INVENTION

Therefore, there is a need for an article transport facility and an inspection unit that enable efficient measurement of the horizontal offset amount of the holding portion relative to the transport target location.

According to an aspect, an article transport facility includes: a holding portion that holds a transport object; a movement operation portion that moves the holding portion along a vertical direction and a horizontal direction; a transport control portion that controls operation of the movement operation portion and the holding portion so as to transport the transport object held by the holding portion to a transport target location; an alignment portion that aligns, during or after transfer of the transport object to the transport target location, a position of the transport object with a proper support position serving as a proper post-transfer support position; and an offset amount measurement portion that measures a horizontal offset amount of the holding portion relative to the proper support position during transfer of the transport object to the transport target location.

The holding portion is capable of holding an article to be transported as the transport object, and capable of holding an inspection unit in place of the article to be transported.

A detection target portion is provided on the holding portion.

A position detection device for detecting a position of the detection target portion is provided in the inspection unit.

The transport control portion performs an inspection transport control in which, after the inspection unit held by the holding portion is transferred to the transport target location and the hold of the inspection unit by the holding portion is released, the holding portion is positioned at a release position at which the hold of the inspection unit is released or a release movement position that is moved relative to the release position in a predetermined direction by a predetermined amount.

The offset amount measurement portion measures a horizontal offset amount of the release position or the release movement position of the holding portion relative to the proper support position, based on detection information from the position detection device in a state in which the inspection unit is aligned with the proper support position by the alignment portion and the holding portion is positioned at the release position or the release movement position.

According to another aspect, an inspection unit includes: a holding target portion that is to be held by a holding portion of a transport device; and a unit body portion positioned below the holding target portion.

An engagement target portion is provided at a bottom of the unit body portion, the engagement target portion being configured to be engaged from above with an engaging portion provided at a transport target location during transfer of the unit body portion to the transport target location by downward movement of the holding portion holding the holding target portion.

The engagement target portion includes a guided part that comes into contact with the engaging portion during transfer of the unit body portion to the transport target location by downward movement of the holding portion and guides a horizontal position of the unit body portion to a proper support position serving as a proper post-transfer support position.

The unit body portion includes a measuring information acquisition portion that acquires information for measuring a relative positional relationship between the unit body portion and the holding portion in a state in which the holding portion is positioned at a release position at which the hold of the holding target portion is released or a release movement position that is moved relative to the release position in a predetermined direction by a predetermined amount.

With these configurations, it is possible to efficiently measure the horizontal offset amount of the holding portion relative to the transport target location.

Further features and advantages of the present invention will become apparent from the following description of illustrative and non-limiting embodiments with reference to the drawings.

DETAILED DESCRIPTION

Hereinafter, an embodiment of an article transport facility will be described with reference to the drawings.

Figure 1:
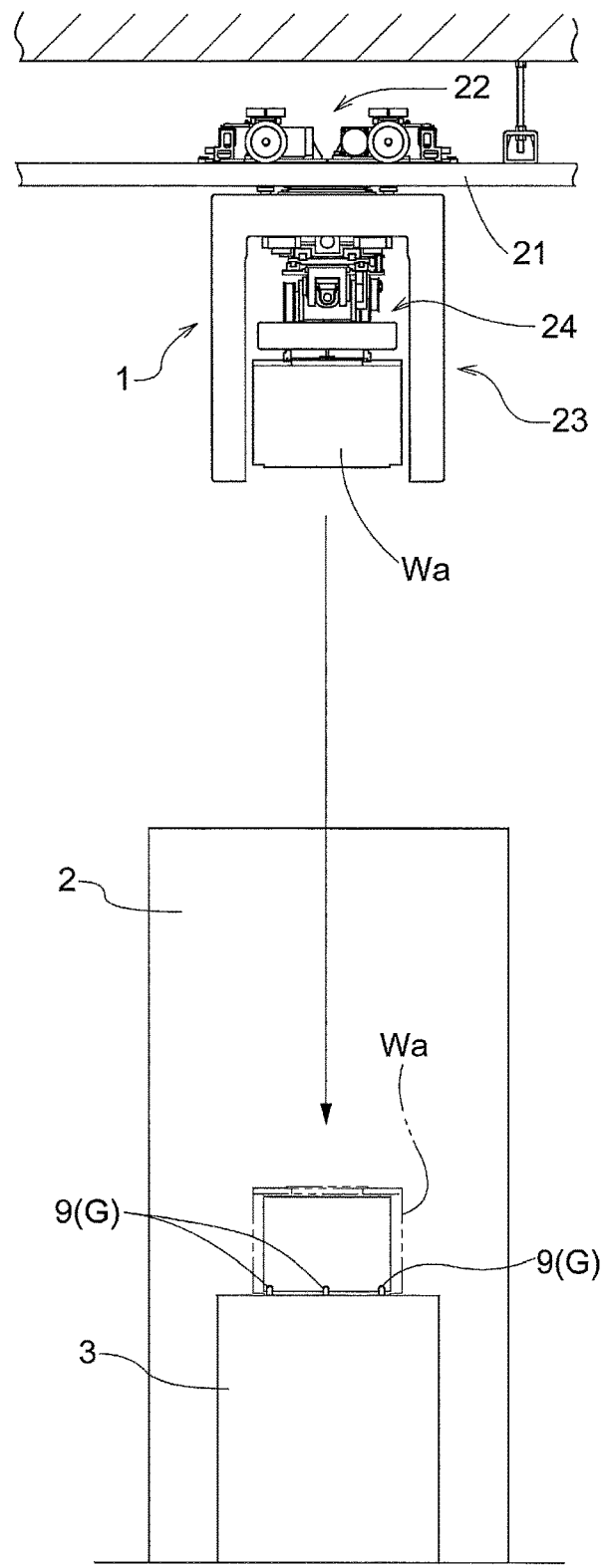
FIG. 1 is a side view of an article transport facility, showing a state in which a ceiling guided vehicle supports a container.
Figure 2:
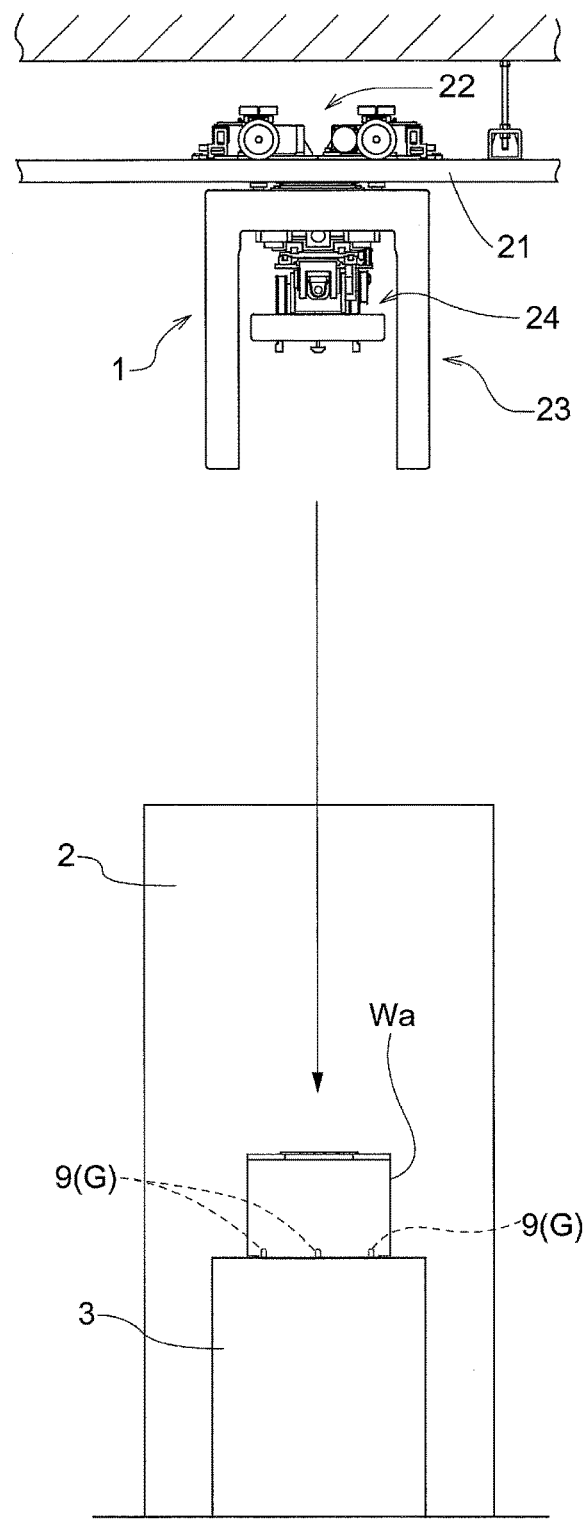
FIG. 2 is a side view of the article transport device, showing a state in which a support platform supports the container.

As shown in FIGS. 1 and 2, the article transport facility includes a ceiling guided vehicle 1 serving as an article transport device that travels in the vicinity of the ceiling along a traveling path to transport a container Wa, a processing device 2 that executes processing on a substrate accommodated in the container Wa, and a support platform 3 installed on the floor surface so as to be adjacent to the processing device 2.

Note that in the present embodiment, a FOUP (Front Opening Unified Pod) that accommodates a semiconductor substrate is used as the container Wa (an exemplary article). In the following description, a direction in which the ceiling guided vehicle 1 travels is referred to as a traveling direction, and a direction orthogonal to the traveling direction in plan view is referred to as a lateral direction.

Container

Figure 3:
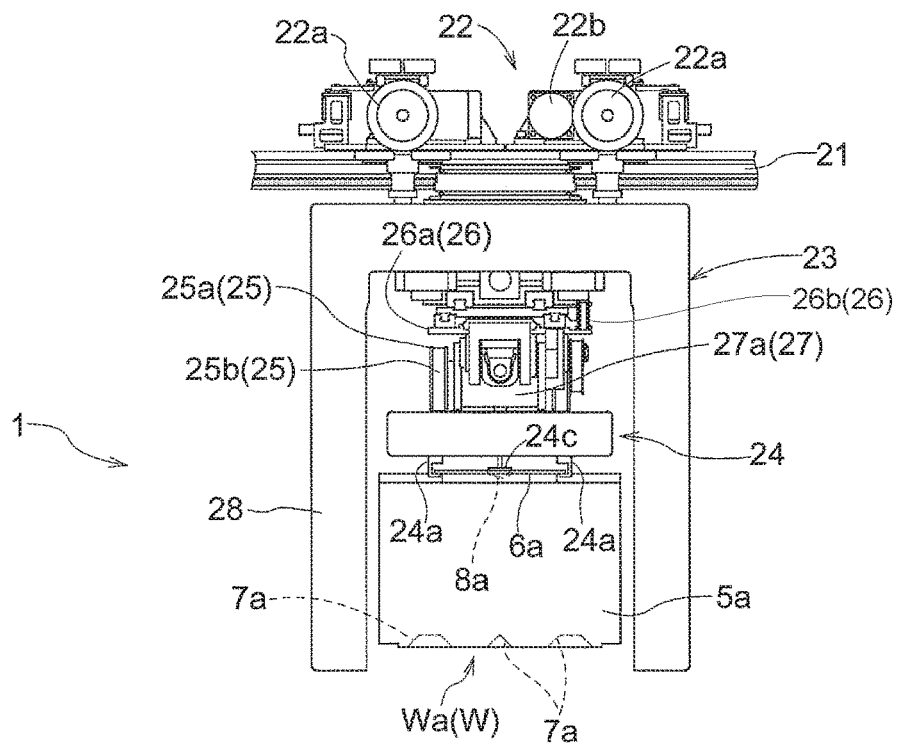
FIG. 3 is a side view of the ceiling guided vehicle supporting a container.

As shown in FIG. 1, a support mechanism 24 of the ceiling guided vehicle 1 is capable of supporting a container Wa to be transported as a transport object W. As shown in FIG. 3, the container Wa includes a container flange portion 6a that is provided at the upper end portion thereof and is supported by the support mechanism 24 of the ceiling guided vehicle 1, and a container body portion 5a that is positioned below the container flange portion 6a and accommodates a plurality of semiconductor substrates. Additionally, the container Wa includes a detachable lid member (not shown) that closes a substrate entrance for placing the substrate in and out formed on the front surface of the container body portion 5a. The ceiling guided vehicle 1 is configured to transport the container Wa in a state in which the container flange portion 6a is suspended and supported.

Figure 4:
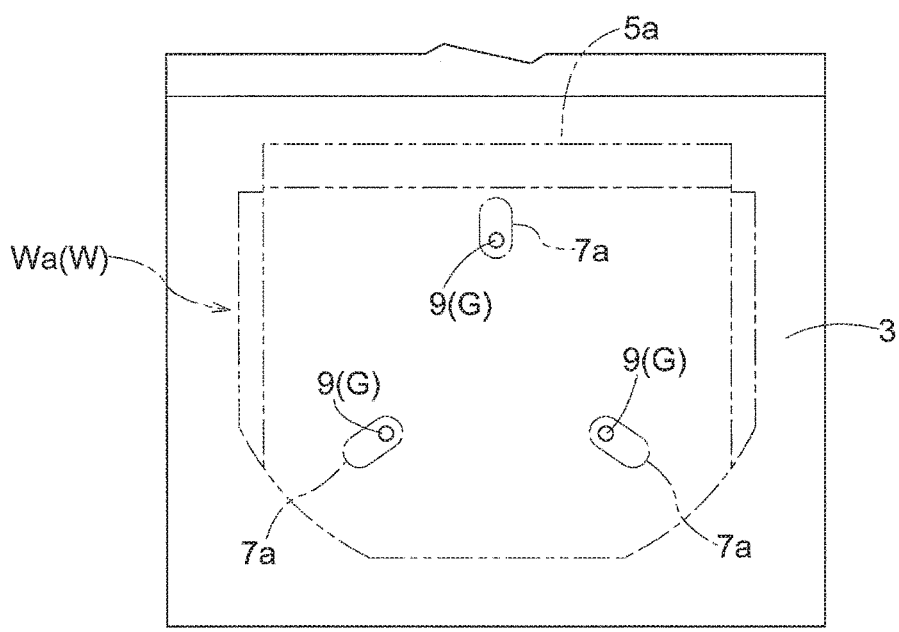
FIG. 4 is a plan view showing a proper support position of the container on the support platform.

As shown in FIGS. 3 and 4, a plurality of (in the present example, three) upwardly recessed container bottom recess 7a are provided on the bottom surface of the container body portion 5a (the bottom surface of the container Wa). The plurality of container bottom recesses 7a are formed in a groove shape. The plurality of container bottom recesses 7a are formed such that their respective longitudinal directions extend radially about a bottom surface reference position. Each of the plurality of container bottom recesses 7a is formed in an upwardly tapered shape, and the inner surface of the container bottom recess 7a is formed as an inclined surface.

The container bottom recesses 7a are each provided at a position at which the corresponding positioning member 9 provided on the support platform 3 engages therewith from below when the container Wa is transferred to the support platform 3 as shown in FIG. 1. Then, if the container Wa is horizontally shifted relative to the proper support position of the support platform 3 when the support mechanism 24 supporting the container flange portion 6a is moved down to transfer the container Wa to the support platform 3, the upper end portion of the positioning members 9 comes into contact with the inner surface of the container bottom recesses 7a, and the container Wa is moved horizontally. This allows the horizontal position of the container Wa to be corrected to the proper support position of the support platform 3.

As shown in FIG. 3, a downwardly recessed container top recess 8a is provided on the top surface of the container flange portion 6a (the top surface of the container Wa). The container top recess 8a is formed in a conical shape. The container top recess 8a is formed in a downwardly tapered shape, and the inner surface of the container top recess 8a is formed as an inclined surface.

The container top recess 8a is configured to be engaged from above with a pressing portion 24c of the support mechanism 24 when the support mechanism 24 is moved down as shown in FIG. 2. Then, if the support mechanism 24 is horizontally shifted relative to the container Wa placed and supported on the support platform 3 when the ceiling guided vehicle 1 moves the support mechanism 24 down, the outer surface of the pressing portion 24c comes into contact with the inner surface of the container top recess 8a, and the support mechanism 24 is moved horizontally. This allows the horizontal position of the support mechanism 24 to be guided to a suitable position relative to the container Wa.

Inspection Unit

Figure 5:
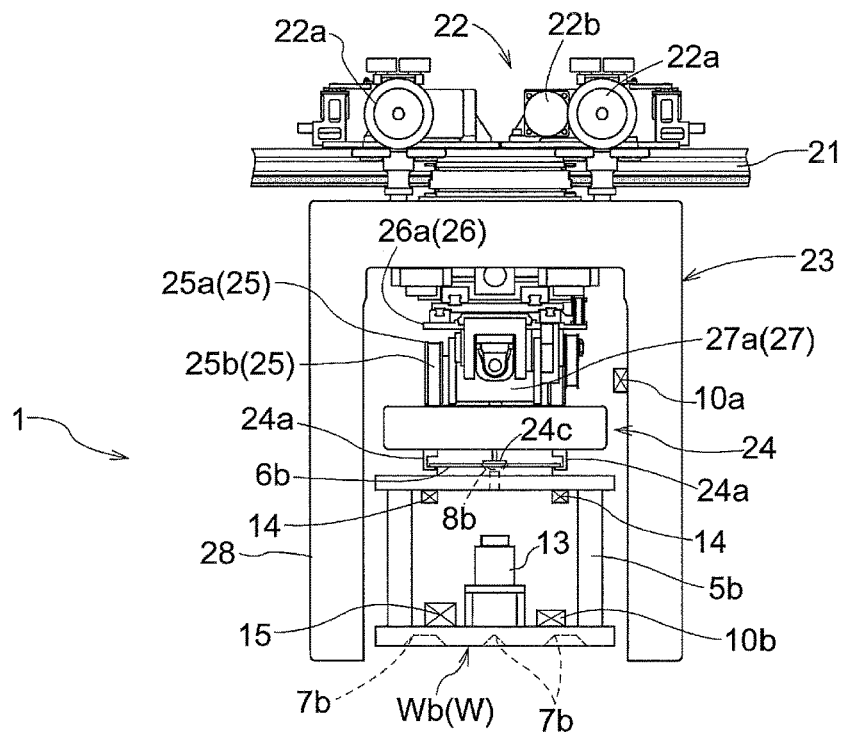
FIG. 5 is a side view of the ceiling guided vehicle supporting an inspection unit.

As shown in FIG. 5, the support mechanism 24 of the ceiling guided vehicle 1 is also capable of supporting an inspection unit Wb as the transport object W in place of the container Wa to be transported. Next, the inspection unit Wb will be described.

The inspection unit Wb includes a unit flange portion 6b serving as a holding target portion that is provided at the upper end portion of the inspection unit Wb and is supported by the support mechanism 24 of the ceiling guided vehicle 1, and a unit body portion 5b that is positioned below the unit flange portion 6b and supports inspecting devices. As the inspecting devices, an imaging device 13, a support detection device 14, an inclination detection device 15, and so forth are provided. The ceiling guided vehicle 1 is configured to transport the inspection unit Wb in a state in which the unit flange portion 6b is suspended and supported.

Figure 6:
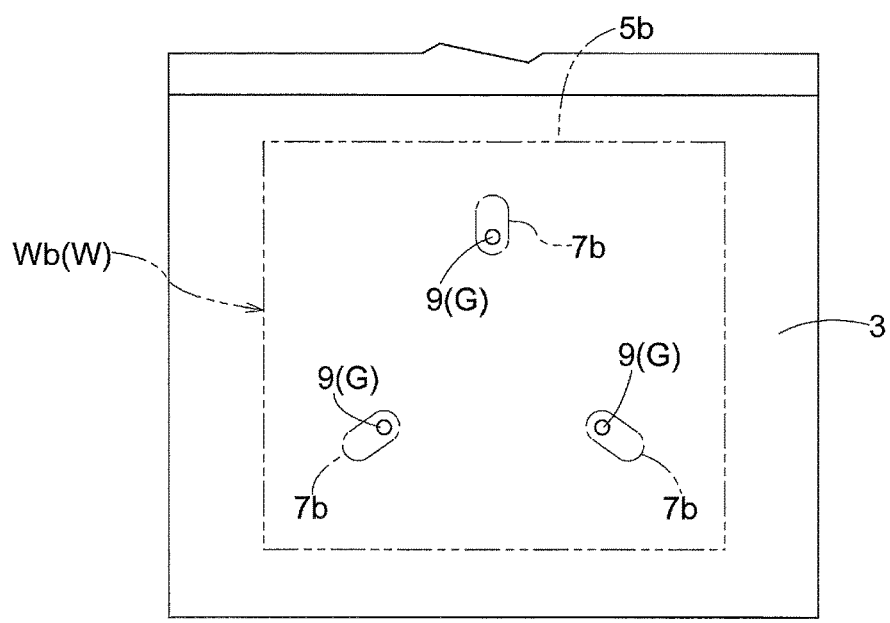
FIG. 6 is a plan view showing a proper support position of the inspection unit on the support platform.

As shown in FIGS. 5 and 6, a plurality of (the same number as the number of the container bottom recesses 7a; in the present example, three) upwardly recessed unit bottom recesses 7b are provided on the bottom surface of the unit body portion 5b (the bottom surface of the inspection unit Wb). The plurality of unit bottom recesses 7b are formed in a groove shape. The plurality of unit bottom recesses 7b are formed such that their respective longitudinal directions extend radially about a bottom surface reference position. In addition, each of the plurality of unit bottom recesses 7b is formed in an upwardly tapered shape, and the inner surface of the unit bottom recess 7b is formed as an inclined surface.

The unit bottom recesses 7b are each provided at a position at which the corresponding positioning member 9 provided on the support platform 3 engages therewith from below when the support mechanism 24 supporting the unit flange portion 6b is moved down to transfer the inspection unit Wb to the support platform 3. Then, if the inspection unit Wb is horizontally shifted relative to the proper support position of the support platform 3 during transfer of the inspection unit Wb to the support platform 3, the upper end portion of the positioning member 9 comes into contact with the inner surface of the unit bottom recess 7b, and the inspection unit Wb is moved horizontally. This allows the horizontal position of the inspection unit Wb to be corrected to the proper support position.

As shown in FIG. 5, a downwardly recessed unit top recess 8b is provided on the top surface of the unit flange portion 6b (the top surface of the inspection unit Wb). The unit top recess 8b is formed in a conical shape. The unit top recess 8b is formed in a downwardly tapered shape, and the inner surface of the unit top recess 8b is formed as an inclined surface.

The unit top recess 8b is configured such that the pressing portion 24c of the support mechanism 24 engages therewith when the ceiling guided vehicle 1 moves the support mechanism 24 down in a state in which the inspection unit Wb is placed on the support platform 3. Then, if the support mechanism 24 is horizontally shifted relative to the inspection unit Wb placed and supported on the support platform 3 when ceiling guided vehicle 1 moves the support mechanism 24 down, the outer surface of the pressing portion 24c comes into contact with the inner surface of the unit top recess 8b, and the support mechanism 24 is moved horizontally. This allows the horizontal position of the support mechanism 24 to be guided to a suitable position relative to the inspection unit Wb.

In this way, the top recess 8 (the container top recess 8a and the unit top recess 8b) serving as the first engagement target portion is provided at the upper portion of the transport object W (the container Wa and the inspection unit Wb) transported by the ceiling guided vehicle 1. The bottom recess 7 (the container bottom recesses 7a and the unit bottom recesses 7b) serving as the second engagement target portion is provided at the bottom portion of the transport object W.

The pressing portion 24c corresponds to the first engaging portion that engages with the top recess 8 from above, and a part of the pressing portion 24c that comes into contact with the inner surface of the container top recess 8a corresponds to the first guide part.

The positioning member 9 corresponds to the second engaging portion that engages with the bottom recess 7 from below, and a part of the positioning member 9 that comes into contact with the inner surface of the container bottom recess 7a corresponds to the second guide part.

The alignment portion G includes a plurality of (the same number as the number of the container bottom recess 7a and the unit bottom recess 7b; in the present example, three) positioning members 9. When the transport object W that is transferred to the support platform 3 is horizontally shifted relative to the proper support position, the position of the transport object W is aligned with the proper support position by the alignment portion G during transfer of the transport object W to the support platform 3.

The positioning member 9 corresponds to the engaging portion provided on the support platform 3 serving as the transport target location, and the unit bottom recess 7b corresponds to the engagement target portion with which the positioning member 9 provided on the support platform 3 engages from below. A part of the unit bottom recess 7b that comes into contact with the upper end portion of the positioning member 9 corresponds to the guided part.

The container Wa and the inspection unit Wb are formed such that the container flange portion 6a and the unit flange portion 6b are positioned at the same height in a state in which the container Wa and the inspection unit Wb are positioned at the proper support position of the support platform 3.

To describe further the inspection unit Wb, the inspection unit Wb includes an imaging device 13, a support detection device 14, and an inclination detection device 15, as shown in FIG. 5. The imaging device 13 images a target plate 31 (see FIG. 7) provided at the lower end portion of the support mechanism 24 of the ceiling guided vehicle 1. The support detection device 14 detects whether the inspection unit Wb is supported by gripping claws 24a of the support mechanism 24. The inclination detection device 15 detects an inclination of the inspection unit Wb relative to the horizontal direction. The inspection unit Wb includes a unit communication portion 10b for transmitting and receiving various types of information to and from the ceiling guided vehicle 1 via wireless communication, and a unit control portion 11b (see FIG. 8) that controls the operation of the imaging device 13 and the unit communication portion 10b.

Figure 7:
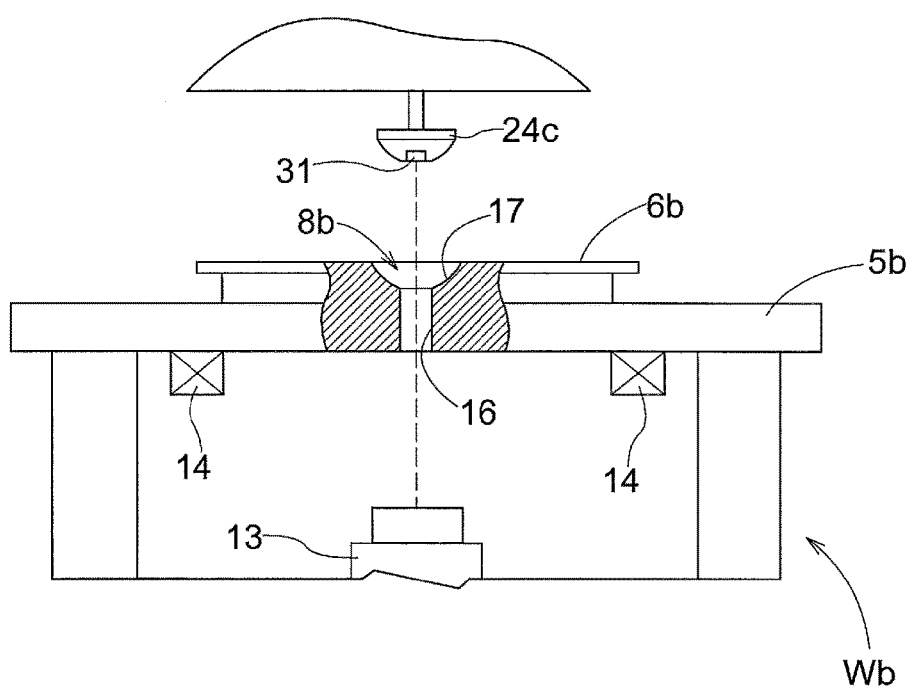
FIG. 7 is an enlarged view of principal parts of a support mechanism and the inspection unit.
Figure 8:
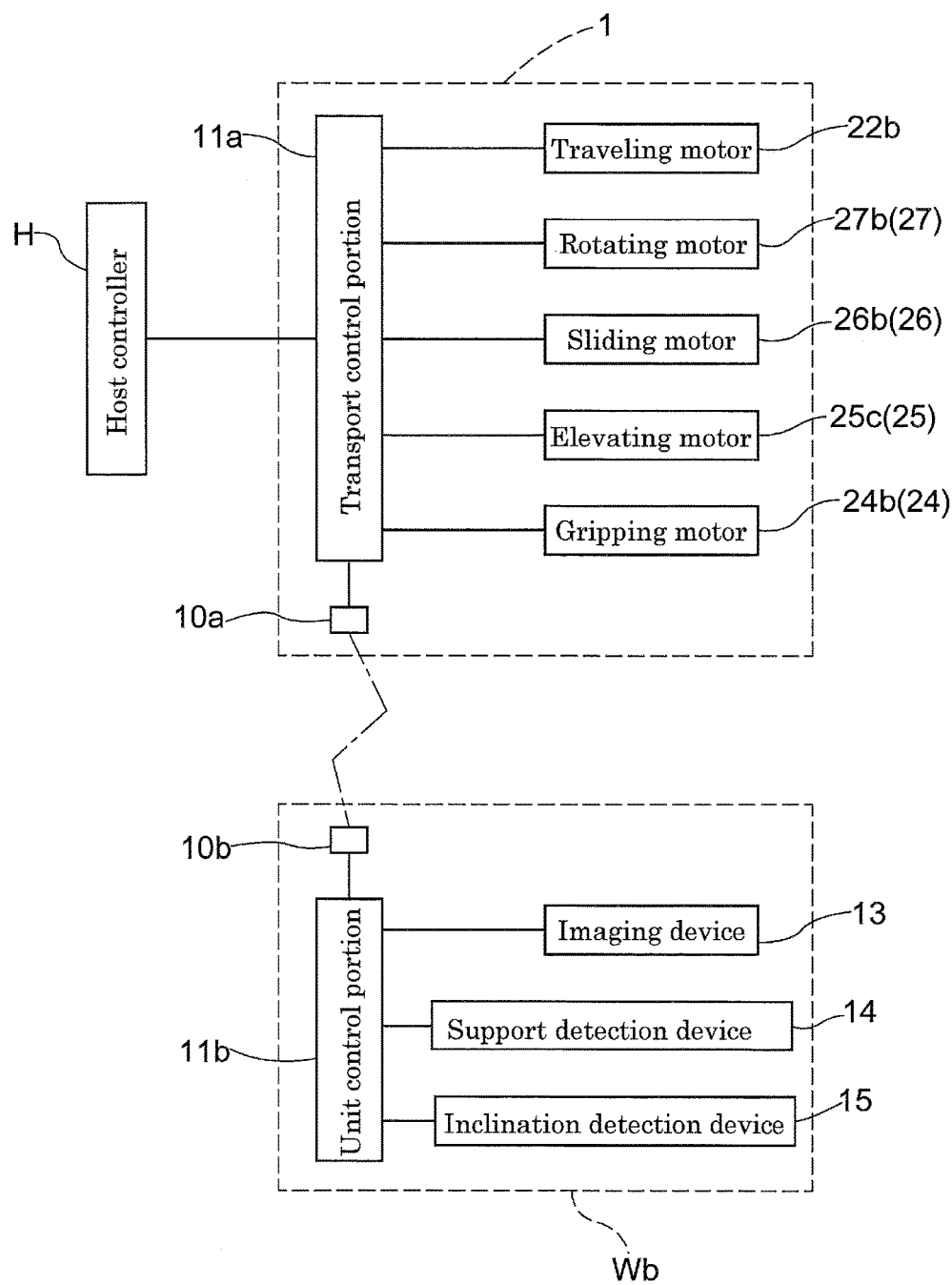
FIG. 8 is a control block diagram.

As shown in FIG. 7, a fitting part 17 to which the pressing portion 24c is fitted and a vertically penetrating inspection hole 16 are formed in the unit top recess 8b formed on the unit flange portion 6b. The fitting part 17 is formed in a conical shape with its apex pointing downward. The inspection hole 16 is formed so as to be positioned at the central location of the fitting part 17. In this way, a funnel-shaped hole is formed by the fitting part 17 and the inspection hole 16.

The imaging device 13 is provided directly below the unit top recess 8b. More particularly, the imaging device 13 is provided directly below the inspection hole 16 formed at the center of the unit top recess 8b. Then, the imaging device 13 is provided in an orientation in which its imaging direction faces directly above such that the entire inspection hole 16 positioned immediately thereabove fits within the imaging range. Accordingly, in a state in which the target plate 31 is present at a position at which it fits within the inspection hole 16 as viewed vertically above from the imaging device 13, the target plate 31 can be imaged by the imaging device 13. By providing the target plate 31 at the pressing portion 24c of the support mechanism 24 and forming the inspection hole 16 in the unit flange portion 6b in this way, the target plate 31 positioned directly above the unit top recess 8b can be imaged by the imaging device 13 positioned directly below the unit top recess 8b.

Note that the imaging device 13 corresponds to the position detection device for detecting the position of the target plate 31.

As shown in FIG. 5, the support detection device 14 is provided on the unit body portion 5b so as to be positioned directly below the gripping claws 24a of the support mechanism 24 in a state in which the inspection unit Wb is supported by the gripping claws 24a. The support detection device 14 is constituted by a range sensor for detecting the distance from the support detection device 14 to the gripping claws 24a of the support mechanism 24.

The inclination detection device 15 is constituted by an angle sensor for detecting an inclination of the inspection unit Wb relative to the horizontal direction.

Ceiling Guided Vehicle

As shown in FIGS. 3 and 5, the ceiling guided vehicle 1 includes a traveling portion 22 and a body portion 23. The traveling portion 22 is configured to be capable of traveling along a traveling path provided above the support platform 3. The traveling portion 22 is capable of traveling along a traveling rail 21 installed in the vicinity of the ceiling. The body portion 23 is suspended and supported by the traveling portion 22 so as to be positioned below the traveling rail 21, and moves the support mechanism 24 supporting the transport object W in the lateral direction and the vertical direction.

The traveling portion 22 includes a traveling wheel 22a that rolls on the traveling rail 21 installed along the traveling path, and a traveling motor 22b that rotationally drives the traveling wheel 22a. The traveling portion 22 is configured to travel along the traveling rail 21 (traveling path) by rotationally driving the traveling wheel 22a by the driving of the traveling motor 22b.

The body portion 23 includes the support mechanism 24, an elevation operation mechanism 25, a rotation operation mechanism 27, and a cover member 28. The support mechanism 24 serves as the supporting portion that suspends and supports the transport object W. The elevation operation mechanism 25 moves the support mechanism 24 up and down relative to the traveling portion 22. The slide operation mechanism 26 slidably moves the support mechanism 24 relative to the traveling portion 22 in the lateral direction. The rotation operation mechanism 27 rotates the support mechanism 24 relative to the traveling portion 22 about the longitudinal axis. The cover member 28 covers the upper side and both sides in the traveling direction (the front side and rear side) of the transport object W supported by the support mechanism 24 positioned at a raising set position (the position shown in FIG. 1, etc.). Note that the support mechanism 24 corresponds to the holding portion that holds the transport object W.

The slide operation mechanism 26 includes a relay portion 26a supported so as to be slidably movable relative to the traveling portion 22 along the lateral direction, and a sliding motor 26b (see FIG. 8) that slidably moves the relay portion 26a along the lateral direction. The slide operation mechanism 26 is configured to move the support mechanism 24 and the elevation operation mechanism 25 along the lateral direction by slidably moving the relay portion 26a along the lateral direction by the driving of the sliding motor 26b. The provision of such a slide operation mechanism 26 makes it possible to finely adjust the support mechanism 24 from the traveling position to the horizontal set position even when the horizontal set position is slightly shifted relative to the traveling position in the lateral direction due to, for example, the installation error of the traveling rail 21 and the distortion of the ceiling guided vehicle 1 caused by aging. The traveling position and the horizontal set position will be described later.

The rotation operation mechanism 27 includes a rotational portion 27a supported so as to be rotatable relative to the relay portion 26a about the longitudinal axis, and a rotating motor 27b (see FIG. 8) that rotates the rotational portion 27a about the longitudinal axis. The rotation operation mechanism 27 is configured to rotate the support mechanism 24 and the elevation operation mechanism 25 about the longitudinal axis by rotating the rotational portion 27a by the driving of the rotating motor 27b.

The elevation operation mechanism 25 includes a wound member 25a supported by the rotational portion 27a, a take-up belt 25b that is wound on the wound member 25a and to which the support mechanism 24 is connected and supported at a distal end portion thereof, and an elevating motor 25c (see FIG. 8) that rotationally drives the wound member 25a. The elevation operation mechanism 25 is configured to move up and down the support mechanism 24 and the transport object W supported thereon by rotationally driving the wound member 25a in the forward or backward direction by the elevating motor 25c so as to take up or let out the take-up belt 25b.

The support mechanism 24 includes a pair of gripping claws 24a, and a gripping motor 24b (see FIG. 8) that moves each of the pair of gripping claws 24a toward or away from each other in the horizontal direction. Then, the support mechanism 24 moves the pair of gripping claws 24a toward each other by the pair of gripping motors 24b, thereby achieving a supported state (see FIG. 1) in which the pair of gripping claws 24a support the flange portion 6 of the transport object W. Meanwhile, the support mechanism 24 moves the pair of gripping claws 24a away from each other by the pair of gripping motors 24b, thereby achieving a support release state (see FIG. 2) in which the support on the flange portion 6 of the transport object W by the pair of gripping claws 24a is released. In this way, the support mechanism 24 is configured to be capable of switching between the supported state and the support release state by controlling the driving of the pair of gripping motors 24b.

Each of the pair of gripping claws 24a is formed in an L-shape in side view. The gripping claws 24a having an L-shape in side view support from below the flange portion 6 at its lower end portion. The pair of gripping claws 24a correspond to a lower support member that supports the transport object W from below. In this way, the support mechanism 24 is configured to be supported by the traveling portion 22 so as to be capable of being raised and lowered, and to suspend and support the transport object W.

Further, the support mechanism 24 includes a pressing portion 24c that is fitted from above to the top recess 8 of the transport object W positioned on the support platform 3 when the support mechanism 24 is moved down as shown in FIG. 2.

The pressing portion 24c is formed in a downwardly bulging conical shape. The target plate 31 serving as the detection target portion is provided at the lower end portion of the pressing portion 24c. Accordingly, in a state in which the inspection unit Wb is supported by the support mechanism 24, the pressing portion 24c is fitted to the unit top recess 8b of the inspection unit Wb, and the target plate 31 of the fitted pressing portion 24c is positioned at the center of the inspection hole 16 in plan view.

As described above, the support mechanism 24 is moved along the traveling direction by the driving of the traveling portion 22, the support mechanism 24 is moved along the vertical direction by the driving of the elevation operation mechanism 25, and the support mechanism 24 is moved in the lateral direction by the driving of the slide operation mechanism 26.

That is, the traveling portion 22, the elevation operation mechanism 25, and the slide operation mechanism 26 constitute a movement operation portion 29 that moves the support mechanism 24 along the vertical direction and the horizontal direction. The movement operation portion 29 is provided in the ceiling guided vehicle 1.

Note that the traveling motor 22b corresponds to the travel driving portion that causes the traveling portion 22 to travel along the traveling path. The elevating motor 25c corresponds to the elevation driving portion that raises and lowers the support mechanism 24 relative to the traveling portion 22. The sliding motor 26b corresponds to the lateral driving portion that moves the relay portion 26a relative to the traveling portion 22 along the lateral direction.

As shown in FIG. 5, the ceiling guided vehicle 1 includes a transport communication portion 10a for transmitting and receiving various types of information to and from the unit communication portion 10b of the inspection unit Wb via wireless communication, and a transport control portion 11a (see FIG. 8) that controls the operation of the movement operation portion 29, the support mechanism 24, and the transport communication portion 10a.

A travel set position, a rotation set position, a lateral set position, and a lowering set position are preset for each of a plurality of support platforms 3. The travel set position is a position at which the traveling portion 22 stops. The rotation set position is a position that defines the rotational position of the support mechanism 24 relative to the traveling portion 22 about the longitudinal axis. The lateral set position is a position that defines the position of the support mechanism 24 relative to the traveling portion 22 in the lateral direction. The lowering set position is a position that defines the position of the support mechanism 24 relative to the traveling portion 22 in the vertical direction. Pieces of information respectively indicating the travel set position, the rotation set position, the lateral set position, and the lowering set position are stored in the transport control portion 11a.

Then, the position of the support mechanism 24 defined by the travel set position and the lateral set position corresponds to a horizontal set position serving as a reference position of the support mechanism 24 before transfer of the transport object W to the support platform 3.

The position of the support mechanism 24 about the longitudinal axis during traveling of the traveling portion 22 serves as a rotation reference position, and the position of the support mechanism 24 in the lateral direction during traveling of the traveling portion 22 serves as a lateral reference position, and the position of the support mechanism 24 in the vertical direction during traveling of the traveling portion 22 serves as a raising set position.

Then, a position at which the support mechanism 24 is positioned at the rotation reference position about the longitudinal axis, is positioned at the lateral reference position in the lateral direction, and is positioned at the raising set position in the vertical direction serves as a traveling position of the support mechanism 24. The traveling portion 22 travels in a state in which the support mechanism 24 is positioned at the traveling position.

The transport control portion 11a is configured to control the operation of motors and the like provided in the ceiling guided vehicle 1 so as to execute a container receiving process and a container delivering process based on a transport instruction from the host controller H installed on the ground side. The container receiving process is a process for receiving the container Wa from a support platform 3 as the transport source. The container delivering process is a process for delivering the container Wa to a support platform 3 as the transport destination. The ceiling guided vehicle 1 receives an article from the support platform 3 as the transport source by executing the container receiving process, and delivering the article to the support platform 3 as the transport destination by executing the container delivering process, thereby transporting the container Wa from the support platform 3 as the transport source to the support platform 3 as the transport destination.

Container Receiving Process

Figure 9:
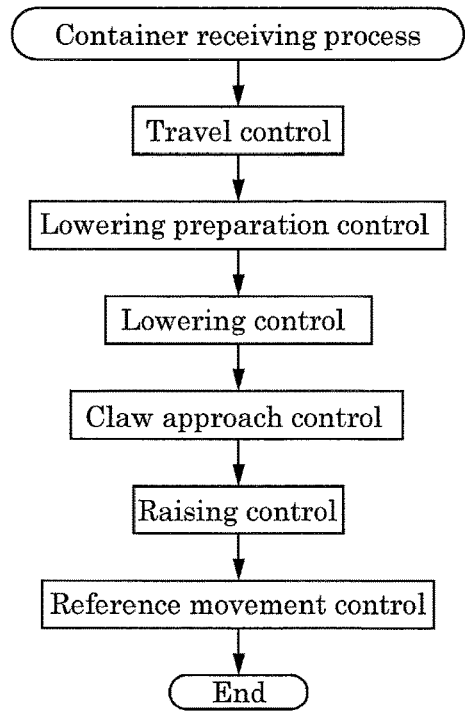
FIG. 9 is a flowchart illustrating a container receiving process.

The container receiving process will be described with reference to the flowchart shown in FIG. 9.

In the container receiving process, a travel control, a lowering preparation control, a lowering control, a claw approach control, a raising control, and a reference movement control are executed in this order.

The travel control of the container receiving process is executed in a state in which the transport object W is not supported by the support mechanism 24. In the travel control, the transport control portion 11a controls the operation of the traveling motor 22b so as to cause the traveling portion 22 to travel to the travel set position corresponding to the support platform 3 as the transport source.

In the lowering preparation control, the transport control portion 11a controls the operation of the sliding motor 26b so as to slidably move the support mechanism 24 to the lateral set position corresponding to the support platform 3 as the transport source. Thereafter, the transport control portion 11a controls the operation of the rotating motor 27b so as to rotate the support mechanism 24 to the rotation set position corresponding to the support platform 3 as the transport source. By the transport control portion 11a executing the lowering preparation control after the travel control in this way, the support mechanism 24 is positioned at a lowering preparation position corresponding to the support platform 3 as the transport source.

In the lowering control, the transport control portion 11a controls the operation of the elevating motor 25c so as to lower the support mechanism 24 at a transport lowering speed to the lowering set position corresponding to the support platform 3 as the transport source. In the claw approach control, the transport control portion 11a controls the operation of the gripping motor 24b so as to switch the support mechanism 24 from the support release state to the supported state.

By the transport control portion 11a executing the lowering control and the claw approach control in this way, the distal end portions of the gripping claws 24a are inserted between the container body portion 5a of the container Wa supported by the support platform 3 and the container flange portion 6a.

In the raising control, the transport control portion 11a controls the operation of the elevating motor 25c so as to raise the support mechanism 24 to the raising set position. By the transport control portion 11a executing the raising control in this way, the container Wa is scooped by the gripping claws 24a and supported on the support mechanism 24, while the support mechanism 24 is being raised from the lowering set position to the raising set position.

In the reference movement control, the transport control portion 11a controls the operation of the rotating motor 27b so as to rotate the support mechanism 24 to the rotation reference position. Thereafter, the transport control portion 11a controls the operation of the sliding motor 26b so as to slidably move the support mechanism 24 to the lateral reference position. By the transport control portion 11a executing the reference movement control in this way, the support mechanism 24 supporting the container Wa is positioned at the traveling position.

Container Delivering Process

Figure 10:
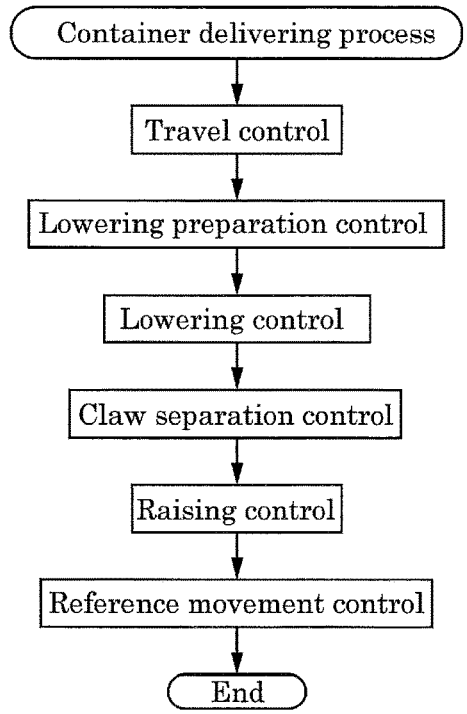
FIG. 10 is a flowchart illustrating a container delivering process.

The container delivering process will be described with reference to the flowchart shown in FIG. 10.

In the container delivering process, a travel control, a lowering preparation control, a lowering control, a claw separation control, a raising control, and a reference movement control are executed in this order. Note that the details of the travel control, the lowering preparation control, the raising control, and the reference movement control in the container delivering process are the same as those of the corresponding controls in the container receiving process. Therefore, the description thereof shall be omitted here.

In the container delivering process, the support mechanism 24 supporting the container Wa is positioned at a lowering preparation position corresponding to the support platform 3 as the transport destination by executing the lowering preparation control after the travel control. Then, by the transport control portion 11a executing the lowering control, the container Wa is transferred to the support platform 3 while the support mechanism 24 is being lowered to the lowering set position. In the lowering control, by the support mechanism 24 being further lowered to the lowering set position, the gripping claws 24a are spaced downward from the container flange portion 6a of the container Wa, and the support for the container Wa by the support mechanism 24 is released.

In the claw separation control, the transport control portion 11a controls the operation of the gripping motor 24b so as to switch the support mechanism 24 from the supported state to the support release state.

Then, the support mechanism 24 that is not supporting the container Wa is positioned at the traveling position by the transport control portion 11a executing the reference movement control after the raising control.

Learning Process

The transport control portion 11a is configured to execute a learning process in accordance with an inspection instruction from the host controller H, in addition to executing the container receiving process and the container delivering process. The learning process is a process for transporting the inspection unit Wb to a support platform 3 as a learning target, and learning the horizontal offset amount of the support mechanism 24 relative to the proper support position of the support platform 3 as the learning target. Then, the horizontal offset amounts of the support mechanism 24 relative to the plurality of support platforms 3 can be separately learned by executing the learning process on each of the plurality of support platforms 3.

Figure 11:
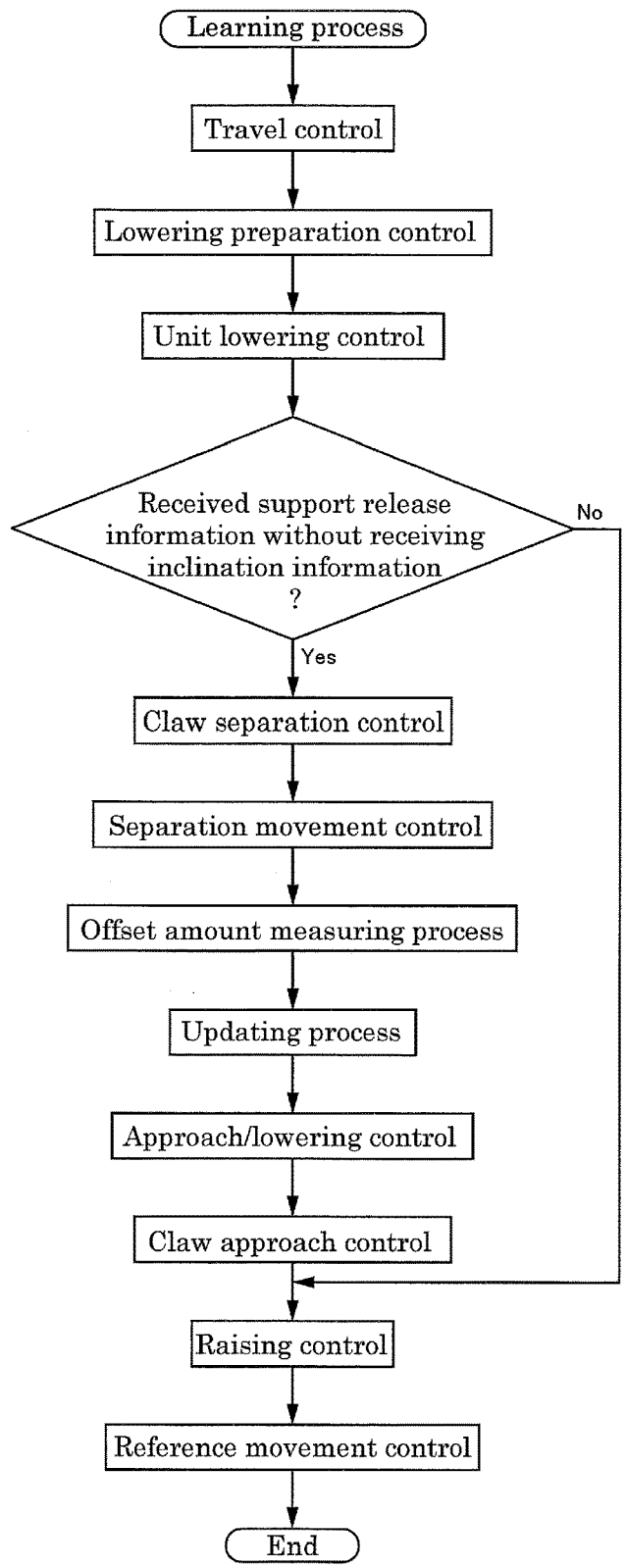
FIG. 11 is a flowchart illustrating a learning process.

The learning process will be described with reference to the flowchart shown in FIG. 11.

In the learning process, a travel control, a lowering preparation control, a unit lowering control, a claw separation control, a separation movement control, an approach/lowering control, a claw approach control, a raising control, and a reference movement control are executed in this order. Note that the details of the travel control, the lowering preparation control, the claw separation control, the claw approach control, the raising control, and the reference movement control in the learning process are the same as those of the corresponding controls in the container receiving process and the container delivering process. Therefore, the description thereof shall be omitted here.

The learning process is executed in a state in which the inspection unit Wb is supported by the support mechanism 24 by a process similar to the above-described container receiving process. In the learning process, the support mechanism 24 is positioned at the lowering preparation position corresponding to the support platform 3 as the transport destination by the transport control portion 11a executing the lowering preparation control after the travel control.

In the unit lowering control, the transport control portion 11a controls the operation of the elevating motor 25c so as to lower the support mechanism 24 at a unit lowering speed, and to stop the lowering of the support mechanism 24 upon receipt of the support release information from the inspection unit Wb while the support mechanism 24 is being lowered. Note that the unit lowering speed is set to be slower than the transport lowering speed, which is a speed at which the support mechanism 24 is lowered during the lowering control in the container receiving process or an approach/lowering control, which will be described below.

To describe further the unit lowering control, when the support mechanism 24 is lowered at the unit lowering speed by the unit lowering control, the inspection unit Wb supported by the support mechanism 24 is transferred to the support platform 3 during the lowering. Then, when the support mechanism 24 is further lowered at the unit lowering speed by the unit lowering control, the gripping claw 24a that has been supporting the unit flange portion 6b is moved downward relative to the unit flange portion 6b and is spaced downward from the unit flange portion 6b. In this way, the support on the inspection unit Wb by the support mechanism 24 is released.

When the support mechanism 24 has been lowered until the gripping claws 24a are spaced downward from the unit flange portion 6b in this way, support release information is transmitted from the inspection unit Wb toward the ceiling guided vehicle 1, as will be described below. The transport control portion 11a ends the unit lowering control based on the support release information transmitted from the inspection unit Wb. Note that the position at which the support mechanism 24 is stopped when the unit lowering control ends is a release position, which is a position at which the holding on the inspection unit Wb is released.

In the unit lowering control, the transport control portion 11a measures the lowering amount of the support mechanism 24 during the unit lowering control, or in other words, the lowering amount of the support mechanism 24 from the raising set position to the release position. The relation between the operation amount (rotation angle) of the elevating motor 25c and the lowering amount of the support mechanism 24 is pre-stored in the form of a map or a relation formula in the article transport facility. For example, the transport control portion 11a measures the lowering amount of the support mechanism 24 corresponding to the operation amount of the elevating motor 25c based on the operation amount of the elevating motor 25c and the above-described map or relation formula.

In the separation movement control, the transport control portion 11a controls the operation of the elevating motor 25c so as to move the support mechanism 24 to a separation position that is set at a position higher than the release position by a set amount. Thereafter, the transport control portion 11a transmits separation completion information toward the inspection unit Wb. The separation position corresponds to the release movement position that is shifted from the release position in a predetermined direction (in the present example, upward in the vertical direction) by a predetermined amount (in the present example, the above-described set amount). The separation position is set at a height at which the lower end of the pressing portion 24c is positioned above the upper end of the top recess 8 of the inspection unit Wb positioned at the proper support position of the support platform 3. Also, the separation position is set at a height at which the lower end of the support mechanism 24 (the lower end of the gripping claws 24a in a support release orientation) is positioned above the upper end of the inspection unit Wb positioned as described above (the upper end of the unit flange portion 6b). By moving the support mechanism 24 to the separation position set at such a height, the inspection unit Wb and the support mechanism 24 are brought into a state in which they do not interfere with each other.

Figure 12:
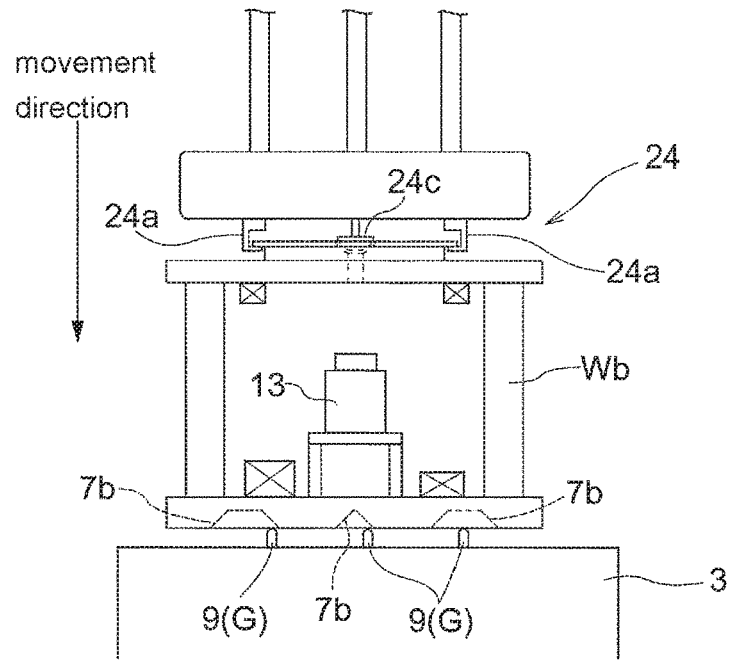
FIG. 12 is a diagram showing the inspection unit and the support mechanism immediately before transfer.
Figure 13:
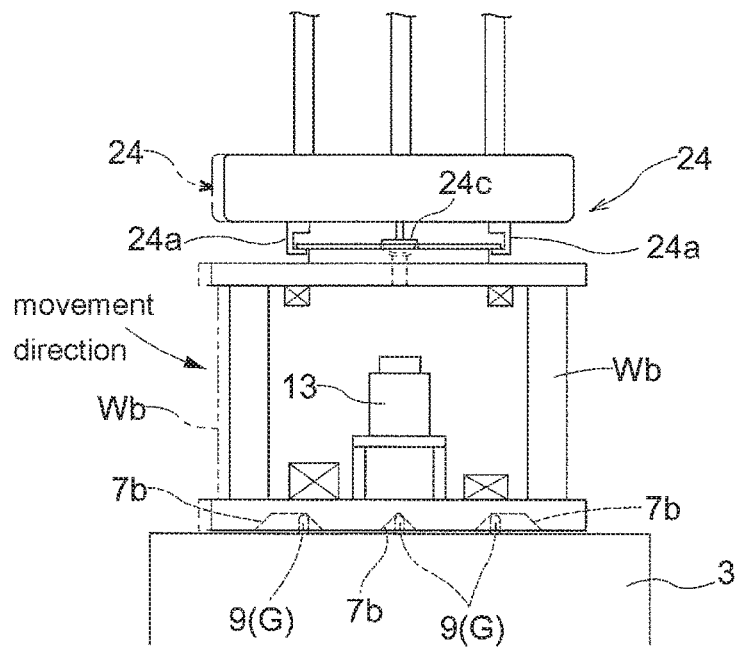
FIG. 13 is a diagram showing the inspection unit and the support mechanism after transfer.
Figure 14:
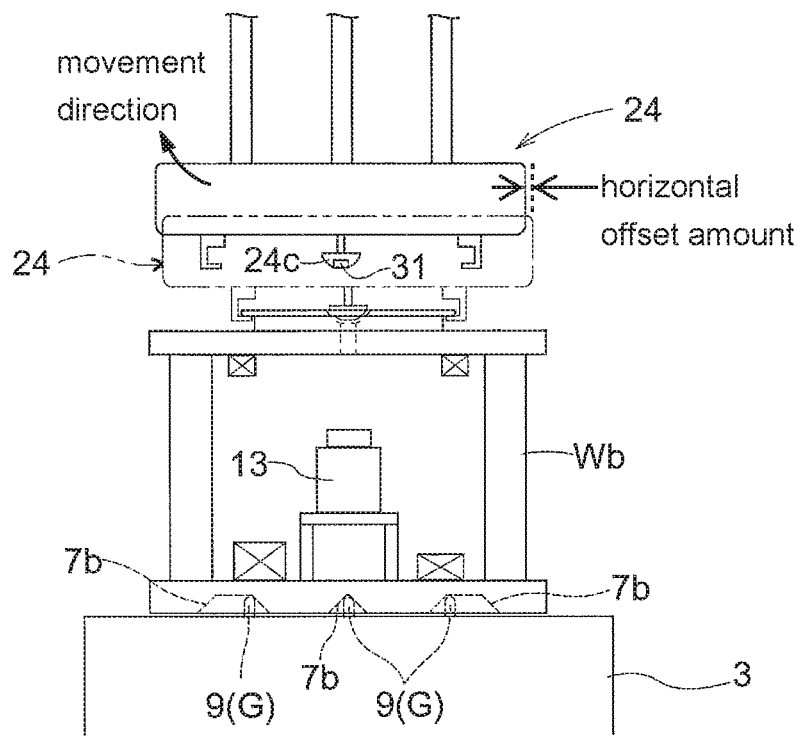
FIG. 14 is a diagram showing a state in which the support mechanism is moved to a release movement position.

Meanwhile, at the time of transferring the inspection unit Wb to the support platform 3 by the unit lowering control, the inspection unit Wb may be horizontally shifted relative to the proper support position of the support platform 3 due to a horizontal shift of the support mechanism 24, as shown in FIG. 12. In such a case, the horizontal position of the inspection unit Wb is corrected to the proper support position of the support platform 3 by the function of the alignment portion G, as shown in FIG. 13. At this time, along with the correction of the position of the inspection unit Wb, the support mechanism 24 is also temporarily moved horizontally, together with the inspection unit Wb. Thereafter, by moving the support mechanism 24 to the separation position by the separation movement control as shown in FIG. 14, the horizontal position of the support mechanism 24 is returned to a position (release position) directly below the lowering preparation position. In this state, an offset amount measuring process is executed. The offset amount measuring process will be described later.

In the approach/lowering control, the transport control portion 11a controls the operation of the elevating motor 25c so as to lower the support mechanism 24 to the release position at the transport lowering speed. Note that when the transport control portion 11a executes the approach/lowering control, the support mechanism 24 may be horizontally shifted relative to the inspection unit Wb positioned at the proper support position of the support platform 3. In such a case, the horizontal position of the support mechanism 24 is corrected to the proper position relative to the inspection unit Wb by the pressing portion 24c engaging with the top recess 8 of the unit flange portion 6b of the inspection unit Wb.

Then, by the transport control portion 11a executing the approach/lowering control and the claw approach control, the distal end portions of the gripping claws 24a are inserted between the unit body portion 5b and the unit flange portion 6b of the inspection unit Wb supported on the support platform 3.

Then, by the transport control portion 11a executing the reference movement control after the raising control, the support mechanism 24 supporting the inspection unit Wb is positioned at the traveling position.

Offset Amount Measuring Process

The unit control portion 11b is configured to execute an offset amount measuring process upon receipt of separation completion information from the ceiling guided vehicle 1, the separation completion information representing that the support mechanism 24 has been moved to the separation position by completion of the separation movement control. The unit control portion 11b is configured to, upon receipt of the separation completion information, control the operation of the imaging device 13 so as to image the target plate 31 by the imaging device 13. Also, the unit control portion 11b is configured to measure the offset amount based on imaging information obtained by the imaging device 13 and pre-stored master image information. Note that the master image information refers to information containing an image of the target plate 31 that has been obtained by the imaging device 13 in a state in which the support mechanism 24 is in a proper position and a proper orientation relative to the inspection unit Wb. The master image information is pre-stored in the unit control portion 11b.

The offset amount is measured as a horizontal shift amount of the position of the target plate 31 in the imaging information obtained by the imaging device 13, relative to the position of the target plate 31 in the master image information. This corresponds to the horizontal shift amount of the central point of the target plate 31 of the support mechanism 24 positioned at the separation position, relative to the center position of the inspection hole 16 that serves as the reference position of the inspection unit Wb positioned at the proper support position. At the time of measuring the offset amount, the direction from the center position of the inspection hole 16 toward the central point of the target plate 31 is also measured. In this way, the unit control portion 11b measures the offset amount as a vector quantity including both a directional component and a shift amount component.

Furthermore, the unit control portion 11b is configured to control the operation of the unit communication portion 10b so as to immediately transmit the offset amount information indicating the offset amount toward the ceiling guided vehicle 1. At this time, the unit control portion 11b is configured to control the operation of the unit communication portion 10b so as to transmit the lowering amount information indicating the lowering amount of the support mechanism 24 toward the ceiling guided vehicle 1, in addition to the offset amount information.

The unit control portion 11b is configured to measure the horizontal offset amount of the support mechanism 24 relative to the proper support position during transfer of the inspection unit Wb to the support platform 3, based on the imaging information from the imaging device 13 in a state in which the inspection unit Wb is aligned with the proper support position by the alignment portion G and the support mechanism 24 is positioned at the release movement position. The unit control portion 11b has the function of the offset amount measurement portion.

Note that the imaging device 13 corresponds to the measuring information acquisition portion that acquires information for measuring the relative positional relationship between the unit body portion 5b and the support mechanism 24 in a state in which the support mechanism 24 is positioned at the separation position (release movement position).

Support Release Detecting Process

Reference distance information indicating the distance from the support detection device 14 to the gripping claws 24a of the support mechanism 24 in a state in which the inspection unit Wb is supported by the support mechanism 24 of the ceiling guided vehicle 1 is pre-stored in the unit control portion 11b. The unit control portion 11b determines that the support of the inspection unit Wb by the support mechanism 24 has been released when a distance shorter than the distance indicated by the reference distance information by a set value or more is detected by the support detection device 14. Then, the unit control portion 11b is configured to control the operation of the unit communication portion 10b so as to immediately transmit the support release information indicating that the support has been released toward the ceiling guided vehicle 1.

Inclination Detecting Process

Reference angle information indicating a reference angle of the inspection unit Wb is pre-stored in the unit control portion 11b, the reference angle being a horizontal inclination of the inspection unit Wb in an orientation in which the inspection unit Wb is supported at the proper support position of the support platform 3. The unit control portion 11b determines that the inspection unit Wb is subjected to an abnormal inclination if an angle inclined by a set value or more than the reference angle is detected by the inclination detection device 15. Then, the unit control portion 11b is configured to control the operation of the unit communication portion 10b so as to immediately transmit, toward the ceiling guided vehicle 1, inclination information indicating that the inspection unit Wb is subjected to an abnormal inclination.

Updating Process

The transport control portion 11a is configured to execute an updating process upon receipt of offset amount information and lowering amount information from the inspection unit Wb. Although FIG. 11 shows an exemplary case where the updating process is executed during the learning process, the present disclosure is not limited to this configuration, and the updating process may be executed after completion of the learning process. In the updating process, the transport control portion 11a updates a travel stop position, a horizontal stop position, and an angle based on the offset amount information. Also, the transport control portion 11a updates the lowering stop position based on the lowering amount information in the updating process. That is, the transport control portion 11a of the present embodiment updates the horizontal set position based on the horizontal offset amount of the support mechanism 24 measured by the offset amount measurement portion, and updates the lowering set position based on the lowering amount of the support mechanism 24 during the inspection transport control. The transport control portion 11a has the function of the position update portion.

The transport control portion 11a execute an emergency stopping process for performing an emergency stop for the ceiling guided vehicle 1 to interrupt the learning process upon receipt of the inclination information from the inspection unit Wb during the learning process (during the unit lowering control). In this way, the transport control portion 11a is configured to interrupt the learning process based on the detection information from the inclination detection device 15 when an inclination greater than or equal to a set value that has been preset in the inclination detection device 15 is detected during the learning process. That is, when an inclination greater than or equal to a set value that has been preset is detected during execution of the learning process, the offset amount measuring process and the updating process, which should be executed thereafter in a normal situation, are suspended. In this case, the raising control and the reference movement control may be thereafter executed to position the support mechanism 24 supporting the inspection unit Wb at the traveling position, and error information may be subsequently output.

Note that the control from the travel control through the separation movement control in the learning process corresponds to the inspection transport control in which, after the inspection unit Wb held by the support mechanism 24 is transferred to the support platform 3 and the hold of the inspection unit Wb by the support mechanism 24 is released, the support mechanism 24 is positioned at the release position at which the hold of the inspection unit Wb is released or the release movement position that is moved relative to the release position in a predetermined direction by a predetermined amount. In this inspection transport control, the support mechanism 24 is lowered in a state in which the support mechanism 24 is moved to the horizontal set position, and, when a state in which the inspection unit Wb is not supported by the gripping claws 24a is detected by the support detection device 14 during the lowering of the support mechanism 24, the lowering of the support mechanism 24 is stopped and the inspection unit Wb is transferred to the support platform 3. Thereafter, the support mechanism 24 is positioned at the release movement position.

The control from the travel control through the claw separation control in the container delivering process corresponds to the article transport control in which, after the support mechanism 24 is stopped at the horizontal set position serving as the reference position of the support mechanism 24 before the container Wa is transferred to the support platform 3, the support mechanism 24 is lowered and the container Wa is transferred to the support platform 3. In the article transport control, after the support mechanism 24 has been stopped at the horizontal set position, the operation of the movement operation portion 29 is controlled so as to complete the transport of the container Wa to the support platform 3 by lowering the support mechanism 24 to the lowering set position in a state in which the support mechanism 24 is moved to the horizontal set position.

In this way, with the article transport facility of the present embodiment, in a state in which the inspection unit Wb is positioned at the proper support position of the support platform 3, the position of the target plate 31 provided on the support mechanism 24 positioned at the release movement position is detected by the imaging device 13 provided in the inspection unit Wb. Then, the horizontal offset amount of the support mechanism 24 relative to the proper support position of the support platform 3 is measured by the unit control portion 11b. By measuring the offset amount in this way, it is no longer necessary to provide the target plate 31 on the support platform 3, and the operator does not need to install the target plate 31 on the support platform 3, thus making it possible to reduce the burden on the operator. Therefore, it is possible to efficiently measure the horizontal offset amount of the support mechanism 24 relative to the support platform 3.

Then, the horizontal set position is updated based on the measured horizontal offset amount of the support mechanism 24, thus facilitating the transfer of the container Wa to the horizontal proper position of the support platform 3 in the subsequent article transport control. For example, even when the horizontal position of the support mechanism 24 is shifted relative to the proper support position due to the aging or the like of the article transport facility, such a shift can be corrected in an early stage, for example, by periodically executing the learning process. Therefore, it is easy to maintain the article transport facility in a proper condition for a long period of time. Since the horizontal set position is updated based on only the data measured by the inspection unit Wb that is properly seated without riding on the positioning member 9, it is possible to avoid such a situation where an erroneous positional update is performed, making it possible to increase the positional accuracy of the horizontal set position.

Alternative Embodiments (1) In the above embodiment, the slide operation mechanism 26 (the relay portion 26*a* and the lateral driving portion) is provided in the article transport device, and the support mechanism 24 is moved to the horizontal set position by the traveling of the traveling portion 22 and the slidable movement of the slide operation mechanism 26. However, the present disclosure is not limited to such a configuration, and it is possible to adopt a configuration in which the horizontal set position is set on the movement path of the traveling portion 22 in plan view, and the support mechanism 24 is moved to the horizontal set position only by the traveling of the traveling portion 22.

(2) Although the transport target location is positioned directly below the traveling rail 21 in the above embodiment, the transport target location may be positioned on the lateral side of the traveling rail 21 in plan view. That is, in the above embodiment, the relay portion 26*a* is moved in the lateral direction by the sliding motor 26*b* so as to finely adjust the support mechanism 24 in the lateral direction when the horizontal set position is slightly shifted relative to the traveling position in the lateral direction. However, the present disclosure is not limited to such a configuration, and it is possible to adopt a configuration in which the relay portion 26*a* is moved in the lateral direction by the sliding motor 26*b* so as to move the support mechanism 24 to a horizontal set position that is set to be actively shifted relative to the traveling position in the lateral direction from the traveling position.

(3) In the above embodiment, the detection target portion is provided at the first engaging portion of the support mechanism 24, the imaging device 13 is provided directly below the first engagement target portion of the inspection unit Wb, and the inspection hole 16 is formed in the first engagement target portion such that the detection target portion can be imaged by the imaging device 13. However, the present disclosure is not limited to such a configuration, and it is possible to adopt a configuration in which the detection target portion is provided at a location that is different, in the horizontal direction, from the location of the first engagement target portion in the support mechanism 24, and the imaging device 13 is provided directly below the detection target portion in a state in which the inspection unit Wb is supported by the support mechanism 24. In this way, it is possible to adopt a configuration in which the detection target portion can be imaged by the imaging device 13, without forming the inspection hole 16 in the first engagement target portion.

(4) Although the position detection device is constituted by the imaging device 13 in the above embodiment, the position detection device may be constituted by another detection device such as a range sensor or a photoelectric sensor. For example, in the case of constituting the position detection device by the range sensor, the detection surface of the detection target portion is installed so as to be inclined in the traveling direction or the lateral direction, and the distance to the detection surface of the detection target portion detected by the range sensor is caused to be different by the range sensor being horizontally shifted relative to the detection target portion. In this way, the offset amount measurement portion may measure the offset amount based on the distance to the detection target portion detected by the range sensor. In the case of constituting the position detection device by a photoelectric sensor, a plurality of photoelectric sensors are arranged in the traveling direction or the lateral direction such that the detection target portion is detected by different combinations of the plurality of photoelectric sensors. In this way, the offset amount measurement portion may measure the offset amount based on detection information detected by the plurality of photoelectric sensors.

(5) In the above embodiment, the position of the detection target portion is detected by the position detection device in a state in which the support mechanism 24 is positioned at the release movement position. However, the present disclosure is not limited to such a configuration. When the pressing portion 24*c* is not provided or there is no possibility that the gripping claws 24*a* positioned at the separation position come into contact with the inspection unit Wb positioned at the proper support position, it is possible to adopt a configuration in which the position of the detection target portion is detected by the position detection device in a state in which the support mechanism 24 is positioned at the release position. That is, the transport control portion 11*a* serving as the offset amount measurement portion may be configured to measure the horizontal offset amount of the support mechanism 24 relative to the proper support position during transfer of the inspection unit Wb to the support platform 3, based on the imaging information from the imaging device 13 in a state in which the inspection unit Wb is aligned with the proper support position by the alignment portion G and the support mechanism 24 is positioned at the release position.

(6) Although the first engaging portion is formed in a downwardly protruding shape and the first engagement target portion is formed in a downwardly recessed shape in the above embodiment, the first engaging portion may be formed in an upwardly recessed shape and the first engagement target portion may be formed in an upwardly protruding shape. Although the second engaging portion is formed in an upwardly recessed shape and the second engagement target portion is formed in an upwardly protruding shape, the second engaging portion may be formed in a downwardly protruding shape and the second engagement target portion may be formed in a downwardly recessed shape.

(7) In the above embodiment, the alignment portion G includes the second engaging portion that engages from below with the second engagement target portion provided on the transport object W, and the position of the transport object W is aligned with the proper support position by the second engaging portion engaging with the second engagement target portion during transfer of the transport object W to the transport target location. However, the present disclosure is not limited to such a configuration. The alignment portion G may include a pressing operation portion that presses the transport object W from the side, and the position of the transport object W may be aligned with the proper support position by pressing the transport object W by the pressing operation portion after the transfer of the transport object W to the transport target location.

(8) In the above embodiment, the inclination detection device 15 is provided in the inspection unit Wb, and the inspection transport control is interrupted when the inspection unit Wb is inclined during the transfer of the inspection unit Wb and is not appropriately transferred to the transport target location. However, the present disclosure is not limited to such a configuration. It is possible to adopt a configuration in which a seating sensor for detecting that the inspection unit Wb is appropriately seated in the transport target location is provided in the inspection unit Wb, and the inspection transport control is interrupted when the transfer target location is not appropriately seated as a result of, for example, the inspection unit Wb riding on the alignment portion G during transfer of the inspection unit Wb to the transport target location.

(9) In the above embodiment, the holding portion is constituted as the support mechanism 24 provided in the ceiling guided vehicle 1 and is configured to suspend and support the flange portion 6 of the transport object W. However, the present disclosure is not limited to such a configuration, and it is possible to adopt a configuration in which the holding portion is constituted as a transfer device of a stacker crane and is configured to support from below the body portion 23 of the transport object W by the article supporting portion of the transfer device.

(10) Although the unit control portion 11b is provided with the function of the offset amount measurement portion in the above embodiment, the transport control portion 11a may be provided with the function of the offset amount measurement portion. The unit control portion 11b controls the operation of the position detection device so as to detect the position of the detection target portion after receiving the separation completion information from the ceiling guided vehicle 1. However, the unit control portion 11b may be configured to control the operation of the position detection device after an elapse of a set time period since it is detected that the support of the inspection unit Wb by the support mechanism 24 has been released.

(11) In the above embodiment, the transmission and reception of information between the ceiling guided vehicle 1 and the inspection unit Wb is performed via wireless communication, with the transport communication portion 10a provided in the ceiling guided vehicle 1 and the unit communication portion 10b provided in the inspection unit Wb. However, the present disclosure is not limited to such a configuration, and it is possible to adopt a configuration in which the ceiling guided vehicle 1 and the inspection unit Wb are connected by a communication cable, and the transmission and reception of information between the ceiling guided vehicle 1 and the inspection unit Wb is performed via wired communication.

(12) The configurations disclosed in each of the embodiments described above (including the above-described embodiment and alternative embodiments; the same applies to the following) are applicable in combination with configurations disclosed in other embodiments so long as no inconsistency arises. With regard to the other configurations as well, the embodiments disclosed herein are in all respects as illustrative, and appropriate changes and modifications may be made thereto without departing from the scope and sprit of the present disclosure.

Outline of the Embodiment

An article transport facility according to the present embodiment includes: a holding portion that holds a transport object; a movement operation portion that moves the holding portion along a vertical direction and a horizontal direction; a transport control portion that controls operation of the movement operation portion and the holding portion so as to transport the transport object held by the holding portion to a transport target location; an alignment portion that aligns, during or after transfer of the transport object to the transport target location, a position of the transport object with a proper support position serving as a proper post-transfer support position; and an offset amount measurement portion that measures a horizontal offset amount of the holding portion relative to the proper support position during transfer of the transport object to the transport target location, wherein the holding portion is capable of holding an article to be transported as the transport object, and capable of holding an inspection unit in place of the article to be transported, a detection target portion is provided on the holding portion, a position detection device for detecting a position of the detection target portion is provided in the inspection unit, the transport control portion performs an inspection transport control in which, after the inspection unit held by the holding portion is transferred to the transport target location and the hold of the inspection unit by the holding portion is released, the holding portion is positioned at a release position at which the hold of the inspection unit is released or a release movement position that is moved relative to the release position in a predetermined direction by a predetermined amount, and the offset amount measurement portion measures a horizontal offset amount of the release position or the release movement position of the holding portion relative to the proper support position, based on detection information from the position detection device in a state in which the inspection unit is aligned with the proper support position by the alignment portion and the holding portion is positioned at the release position or the release movement position.

With this configuration, it is possible to move the holding portion holding an article to the movement operation portion to transport the article to a transport target location, and move the holding portion holding an inspection unit by the movement operation portion to transport the inspection unit to the transport target location.

The transport object (the article and the inspection unit) that is transported to the transport target location is aligned with the proper support position by the alignment portion during or after transport to the transport target location.

By the transport control portion performing the inspection transport control, the holding portion is moved to the release position or the release movement position corresponding to the transport target location after the inspection unit has been transferred to the transport target location. Then, in a state in which the holding portion is positioned at the release position or the release movement position in this way, the inspection unit is positioned at the proper support position by the alignment function of the alignment portion as described above.

The release position of the holding portion is a position at which the hold of the inspection unit is released after the inspection unit has been transferred to the transport target location. In this way, by releasing the hold of the inspection unit, the inspection unit positioned at the proper support position and the holding portion can be separated from each other. Even in a state in which the holding portion is positioned at the release position, the inspection unit and the holding portion may be in contact with each other as a result of, for example, the inspection unit being moved horizontally by the alignment portion. In such a case, the inspection unit positioned at the proper support position and the holding portion can be separated by moving the holding portion to the release movement position. In this way, by positioning the holding portion at the release position or the release movement position, the holding portion can be separated from the inspection unit positioned at the proper support position, thereby preventing the holding portion from interfering with the inspection unit.

Then, in a state in which the inspection unit is positioned at the proper support position of the transport target location, the position of the detection target portion provided in the holding portion positioned at release position or the release movement position is detected by the position detection device provided in that inspection unit, and the horizontal offset amount of the holding portion relative to the proper support position of the transport target location is measured by the offset amount measurement portion. By measuring the offset amount in this way, it is no longer necessary to provide the detection target portion at the transport target location, and the operator does not need to install the detection target portion at the transport target location, thus making it possible to reduce the burden on the operator. Thus, it is possible to efficiently measure the horizontal offset amount of the holding portion relative to the transport target location.

In an aspect, it is preferable that the transport control portion performs an article transport control in which, after the holding portion is stopped at a horizontal set position serving as a reference position of the holding portion before an article is transferred to the transport target location, the holding portion is lowered and the article is transferred to the transport target location, and the article transport facility further includes a position update portion that updates the horizontal set position based on the horizontal offset amount of the holding portion measured by the offset amount measurement portion.

With this configuration, after the holding portion holding the article has been positioned at the horizontal set position, the holding portion is lowered and the article is transferred to the transport target location. Then, the horizontal set position is updated by the position update portion based on the horizontal offset amount of the holding portion measured by the offset amount measurement portion, thus facilitating the transfer of the article to the horizontal proper position of the transport target location in the subsequent article transport control for a long period of time. At this time, the horizontal set position is automatically updated by the position update portion based on the measured offset amount, and it is thus possible to reduce the burden on the operator as compared with when the operator manually updates the horizontal set position.

In an aspect, it is preferable that the holding portion includes a lower support member that supports the transport object from below, the inspection unit includes a support detection device that detects whether the inspection unit is supported by the lower support member, the inspection transport control is a control in which the holding portion is lowered in a state in which the holding portion is moved to the horizontal set position, and, when a state in which the inspection unit is not supported by the lower support member is detected by the support detection device during the lowering of the holding portion, the lowering of the holding portion is stopped and the inspection unit is transferred to the transport target location, the article transport control is a control in which operation of the movement operation portion is controlled so as to complete transport of an article to the transport target location by lowering the holding portion to a lowering set position in a state in which the holding portion is moved to the horizontal set position, and the position update portion updates the lowering set position based on a lowering amount of the holding portion during the inspection transport control.

With this configuration, when the holding portion is lowered by the inspection transport control in a state in which the holding portion is moved to the horizontal set position, the inspection unit is transferred to the transport target location by the lowering. When the holding portion is further lowered, the holding portion is moved downward relative to the inspection unit transferred to the transport target location, and the holding to the inspection unit by the holding portion supporting the lower support member from below is released. When the holding of the inspection unit by the holding portion is released in this way, the release is detected by the support detection device, and the lowering of the holding portion is stopped based on the detection information from the support detection device.

Then, by lowering the holding portion to the lowering set position by the article transport control in a state in which the holding portion is positioned at the horizontal set position in the horizontal direction, the article can be transferred to the transport target location. Since the lowering set position is updated based on the lowering amount of the holding portion during the transfer of the inspection unit to the transport target location, it is possible to lower the holding portion to an appropriate height relative to the transport target location in the subsequent article transport control for a long period of time. At this time, the lowering set position is automatically updated by the position update portion based on the measured lowering amount of the holding portion, and it is thus possible to reduce the burden on the operator as compared with when the operator manually updates the lowering set position.

In an aspect, it is preferable that the article transport facility includes a traveling portion capable of traveling along a traveling path that is set above the transport target location, wherein the movement operation portion includes a travel driving portion that causes the traveling portion to travel along the traveling path, and an elevation driving portion that raises and lowers the holding portion relative to the traveling portion, and the holding portion is configured to suspend and support the transport object.

With this configuration, the holding portion can be moved to the release position by lowering the holding portion in a state in which the traveling portion is traveled to a preset stop position relative to the transport target location. Then, the stop position of the traveling portion can be updated based on the offset amount measured by the offset amount measurement portion.

In an aspect, it is preferable that, provided that a lateral direction is a direction intersecting, in plan view, a traveling direction in which the traveling portion travels, the article transport facility includes: a relay portion that is supported by the traveling portion so as to be movable in the lateral direction; the holding portion that is supported by the relay portion so as to be capable of being raised or lowered and that suspends and supports the transport object; a lateral driving portion that moves the relay portion relative to the traveling portion along the lateral direction; and the elevation driving portion that moves the holding portion up and down relative to the relay portion, and the movement operation portion includes the lateral driving portion.

With this configuration, the holding portion can be moved to the release position by lowering the holding portion in a state in which the traveling portion is traveled to the preset stop position relative to the transport target location and the relay portion is laterally moved to a set lateral movement position relative to the transport target location. Then, the stop position of the traveling portion and the movement position of the relay portion can be updated based on the offset amount measured by the offset amount measurement portion.

In an aspect, it is preferable that a first engagement target portion is provided at a top of the transport object, a first engaging portion that engages with the first engagement target portion from above is provided on the holding portion, the first engaging portion includes a first guide part that comes into contact with the first engagement target portion and guides a horizontal position of the holding portion to a proper position relative to the transport object when the holding portion is horizontally shifted relative to the transport object during engagement with the first engagement target portion, the detection target portion is provided on the first engaging portion of the holding portion, the position detection device is constituted by an imaging device that images the detection target portion, the offset amount measurement portion is configured to measure the offset amount based on imaging information obtained by the imaging device, the imaging device is provided directly below the first engagement target portion of the inspection unit, and the first engagement target portion has an inspection hole formed therein that allows the detection target portion positioned directly above the first engagement target portion to be imaged by the imaging device.

With this configuration, the horizontal offset amount of the holding portion relative to the proper support position can be easily measured in an appropriate manner by imaging the position of the detection target portion provided in the first engaging portion by the imaging device, and measuring the offset amount based on the imaging information from the imaging device.

By forming the inspection hole in first engagement target portion, the detection target portion of the holding portion can be imaged, with the imaging device installed directly below the first engagement target portion. Accordingly, it is easy to image the detection target portion provided in the first engaging portion by the imaging device.

In an aspect, it is preferable that the release movement position is set at a position at which a lower end of the first engaging portion is above an upper end of the first engagement target portion of the inspection unit positioned at the proper support position.

With this configuration, the holding portion can be appropriately separated from the inspection unit positioned at the proper support position by moving the holding portion to the release movement position.

In an aspect, it is preferable that a second engagement target portion is provided at a bottom of the transport object, the alignment portion includes a second engaging portion that engages with the second engagement target portion from below, and the second engaging portion includes a second guide part that comes into contact with the second engagement target portion of the transport object that is transferred to the transport target location by downward movement of the holding portion and guides the horizontal position of the transport object to the proper support position.

With this configuration, when the transport object is horizontally shifted relative to the proper support position at the time of transferring the transport object to the transport target location, the article is aligned with the proper support position by the second engagement target portion coming into contact with and being guided to the second guide part of the second engaging portion.

In this way, the position of the transport object can be aligned with the proper support position by using the downward movement of the transport object at the time of transferring the transport object to the transport target location. Thus, it is possible to simplify the structure of the alignment portion. For example, the alignment portion can be configured in a simple manner as compared with a configuration in which the alignment portion is configured to align the position of the transport object with the proper support position by pressing the transport object unloaded on the transport target location in the horizontal direction.

In an aspect, it is preferable that the inspection unit includes an inclination detection device for detecting an inclination of the inspection unit relative to the horizontal direction, and, when an inclination greater than or equal to a preset set value is detected based on detection information from the inclination detection device during execution of the inspection transport control, the transport control portion interrupts the inspection transport control.

With this configuration, by setting a value less than or equal to the inclination of the inspection unit when the inspection unit rides on the second engaging portion as a set value, it is possible to determine whether the inspection unit rides on the second engaging portion based on a detection result obtained by the inclination detection device. That is, if an inclination greater than or equal to the set value is detected by the inclination detection device when the transport control portion unloads the inspection unit on the transport target location by executing the inspection transport control, it can be determined that the second engaging portion has not appropriately engaged with the second engagement target portion as a result of the inspection unit riding on the second engaging portion.

Then, the inspection transport control is interrupted if it is determined that the second engaging portion has not appropriately engaged with the second engagement target portion. Accordingly, it is possible to prevent the offset amount from being measured in a state in which the inspection unit is not positioned at the proper support position. Thus, for example, in the case of a configuration in which the horizontal set position is updated based on the measured offset amount, it is possible to prevent a situation where an erroneous positional update is performed based on the data measured in an improper state.

An inspection unit according to the present embodiment includes: a holding target portion that is to be held by a holding portion of a transport device; and a unit body portion positioned below the holding target portion, wherein an engagement target portion is provided at a bottom of the unit body portion, the engagement target portion being configured to be engaged from above with an engaging portion provided at a transport target location during transfer of the unit body portion to the transport target location by downward movement of the holding portion holding the holding target portion, the engagement target portion includes a guided part that comes into contact with the engaging portion during transfer of the unit body portion to the transport target location by downward movement of the holding portion and guides a horizontal position of the unit body portion to a proper support position serving as a proper post-transfer support position, and the unit body portion includes a measuring information acquisition portion that acquires information for measuring a relative positional relationship between the unit body portion and the holding portion in a state in which the holding portion is positioned at a release position at which the hold of the holding target portion is released or a release movement position that is moved relative to the release position in a predetermined direction by a predetermined amount.

With this configuration, when the inspection unit is horizontally shifted relative to the proper support position during transfer of the inspection unit to the transport target location, the inspection unit can be aligned with the proper support position by the engaging portion coming into contact with and being guided to the guided part of the engagement target portion.

The release position is a position at which the holding of the inspection unit is released after the inspection unit has been transferred to the transport target location. In this way, by releasing the holding of the inspection unit, the inspection unit positioned at the proper support position and the holding portion can be separated. Even in a state in which the holding portion is positioned at the release position, the inspection unit and the holding portion may be in contact with each other as a result of being moved horizontally by the alignment portion, for example. In such a case, the inspection unit positioned at the proper support position and the holding portion can be separated by moving the holding portion to the release movement position. In this way, the holding portion can be separated from the inspection unit positioned at the proper support position by positioning the holding portion at the release position or the release movement position, thus making it possible to prevent the holding portion from interfering with the inspection unit.

Then, by acquiring the information for measuring the relative positional relationship between the unit body portion and the holding portion by the measuring information acquisition portion, it is no longer necessary to provide the detection target portion for acquiring the information by the measuring information acquisition portion at the transport target location. Since the operator does not need to install the detection target portion at the transport target location, it is possible to reduce the burden on the operator. Thus, it is possible to efficiently measure the horizontal offset amount of the holding portion relative to the transport target location.

Note that the preferred configurations described above with regard to the article transport facility may also be incorporated into the inspection unit as appropriate.

The invention claimed is:

1. An article transport facility comprising:
a holding portion configured to releasably hold a transport object;
a movement operation portion that moves the holding portion along a vertical direction and a horizontal direction;
a transport controller configured to control operation of the movement operation portion and the holding portion so as to transport the transport object held by the holding portion to a transport target location;
an alignment portion configured to align, during or after transfer of the transport object to the transport target location, a position of the transport object with a proper support position serving as a proper post-transfer support position;
an inspection unit configured to measure a horizontal offset amount of the holding portion relative to the proper support position during transfer of the transport object to the transport target location,
wherein the holding portion is configured to hold an article to be transported as the transport object, and configured to hold the inspection unit in place of the article to be transported;
wherein a detection target portion is provided on the holding portion,
wherein the inspection unit includes an imaging device for detecting a position of the detection target portion and a holding target portion to be held by the holding portion,
wherein the transport controller is configured to perform an inspection transport control in which, after the inspection unit held by the holding portion is transferred to the transport target location and the hold of the inspection unit by the holding portion is released, the holding portion is positioned at a release position at which the hold of the inspection unit is released or a release movement position that is moved relative to the release position in a predetermined direction by a predetermined amount,
wherein the inspection unit is configured to measure the horizontal offset amount of the release position or the release movement position of the holding portion relative to the proper support position, based on detection information from the imaging device in a state in which the inspection unit is aligned with the proper support position by the alignment portion and the holding portion is positioned at the release position or the release movement position,
wherein the holding portion comprises at least one gripping claw,
wherein the movement operation portion comprises a traveling wheel configured to roll on a traveling rail and an elevating motor,
wherein the alignment portion comprises at least one positioning member on a support platform engageable with at least one bottom recess of the transport object,
wherein the detection target portion comprises a target plate,
wherein the imaging device comprises a range sensor or photoelectrical sensor,
wherein the release movement position is set at a position higher than the release position by a set amount,
wherein the detection target portion is provided in a lower surface of the holding portion, and
wherein in a state in which the holding portion is positioned at the release position, the target plate of the detection target portion is positioned above the inspection unit.

2. The article transport facility according to claim 1, wherein:
the transport controller is configured to perform an article transport control in which, after the holding portion is stopped at a horizontal set position serving as a reference position of the holding portion before an article is transferred to the transport target location, the holding portion is lowered and the article is transferred to the transport target location, and
wherein the transport controller is configured to update the horizontal set position based on the horizontal offset amount of the holding portion measured by the inspection unit.

3. The article transport facility according to claim 2, wherein:
the at least one gripping claw of the holding portion supports the transport object from below,
the inspection unit includes a range sensor that detects whether the inspection unit is supported by the at least one gripping claw,
the inspection transport control is a first control in which the holding portion is lowered in a state in which the holding portion is moved to the horizontal set position, and, when a state in which the inspection unit is not supported by the at least one gripping claw is detected by the range sensor during the lowering of the holding portion, the lowering of the holding portion is stopped and the inspection unit is transferred to the transport target location, the article transport control is a second control in which operation of the movement operation portion is controlled so as to complete transport of an article to the transport target location by lowering the holding portion to a lowering set position in a state in which the holding portion is moved to the horizontal set position, and the transport controller updates the lowering set position based on a lowering amount of the holding portion during the inspection transport control.

4. The article transport facility according to claim 1, wherein the traveling wheel is a part of a traveling portion configured to travel along a traveling path that is set above the transport target location, wherein the movement operation portion includes a traveling motor configured to cause the traveling portion to travel along the traveling path, and the elevating motor is configured to raise and lower the holding portion relative to the traveling portion, and the holding portion is configured to suspend and support the transport object.

5. The article transport facility according to claim 4, wherein, provided that a lateral direction is a direction intersecting, in plan view, a traveling direction in which the traveling portion travels, the article transport facility comprises:

a sliding motor configured to move the holding portion relative to the traveling portion along the lateral direction;

wherein the movement operation portion includes the sliding motor.

6. The article transport facility according to claim 4, wherein:

a first engagement target portion is provided at a top of the transport object, a first engaging projection that engages with the first engagement target portion from above is provided on the holding portion, wherein the first engaging projection comes into contact with the first engagement target portion and guides a horizontal position of the holding portion to a proper position relative to the transport object when the holding portion is horizontally shifted relative to the transport object during engagement with the first engagement target portion, wherein the detection target portion is provided on the first engaging projection of the holding portion, wherein the imaging device is configured to image the detection target portion, wherein the inspection unit is configured to measure the offset amount based on imaging information obtained by the imaging device, wherein the imaging device is provided directly below the first engagement target portion of the inspection unit, and wherein the first engagement target portion has an inspection hole formed therein that allows the detection target portion positioned directly above the first engagement target portion to be imaged by the imaging device.

7. The article transport facility according to claim 6, wherein the release movement position is set at a position at which a lower end of the first engaging projection is above an upper end of the first engagement target portion of the inspection unit positioned at the proper support position.

8. The article transport facility according to claim 1, wherein:

a second engagement target portion is provided at a bottom of the transport object, the at least one positioning member of the alignment portion engages with the second engagement target portion from below, and the at least one positioning member comes into contact with the second engagement target portion of the transport object that is transferred to the transport target location by downward movement of the holding portion and guides the horizontal position of the transport object to the proper support position.

9. The article transport facility according to claim 8, wherein the inspection unit includes an angle sensor for detecting an inclination of the inspection unit relative to the horizontal direction, and, when an inclination greater than or equal to a preset set value is detected based on detection information from the angle sensor device during execution of the inspection transport control, the transport controller is configured to interrupt the inspection transport control.

* * * * *